United States Patent
Flader et al.

(10) Patent No.: US 11,220,423 B2
(45) Date of Patent: Jan. 11, 2022

(54) REDUCED MEMS CAVITY GAP

(71) Applicant: InvenSense, Inc., San Jose, CA (US)

(72) Inventors: Ian Flader, Redwood City, CA (US); Dongyang Kang, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/408,239

(22) Filed: May 9, 2019

(65) Prior Publication Data
US 2020/0140263 A1    May 7, 2020

Related U.S. Application Data

(60) Provisional application No. 62/754,069, filed on Nov. 1, 2018.

(51) Int. Cl.
*B81C 1/00* (2006.01)
*B81B 7/02* (2006.01)

(52) U.S. Cl.
CPC .......... *B81C 1/00047* (2013.01); *B81B 7/02* (2013.01); *B81C 1/00531* (2013.01); *B81B 2203/0315* (2013.01); *B81C 2201/0132* (2013.01); *B81C 2203/036* (2013.01)

(58) Field of Classification Search
CPC ... B81C 1/00; B81C 1/00047; B81C 1/00531; B81C 2201/0132; B81C 2203/036; B81C 1/00269; B81B 7/02
USPC ........................................................ 257/415
See application file for complete search history.

(56) References Cited

U.S. PATENT DOCUMENTS

| | | | |
|---|---|---|---|
| 8,350,346 B1 | 1/2013 | Huang et al. | |
| 9,567,208 B1* | 2/2017 | Cheng | B81C 1/00293 |
| 9,714,165 B1* | 7/2017 | Hrudey | B81C 1/00301 |
| 2004/0077154 A1* | 4/2004 | Nagarajan | H01L 21/76898 438/455 |
| 2007/0295456 A1* | 12/2007 | Gudeman | H01B 1/026 156/379.7 |
| 2009/0294879 A1* | 12/2009 | Bhagavat | B81C 1/00269 257/415 |
| 2009/0311819 A1* | 12/2009 | Chang | B81C 1/0015 438/51 |
| 2010/0061073 A1* | 3/2010 | Oldsen | B81C 1/00317 361/807 |
| 2010/0258882 A1* | 10/2010 | Magnee | B81C 1/00246 257/415 |
| 2012/0326248 A1* | 12/2012 | Daneman | B81B 7/02 257/415 |
| 2013/0313947 A1* | 11/2013 | Chen | H03H 9/1057 310/348 |
| 2014/0231995 A1* | 8/2014 | Ando | B81C 1/00301 257/741 |
| 2014/0264661 A1* | 9/2014 | Cheng | B81C 3/001 257/417 |
| 2015/0298965 A1* | 10/2015 | Tsai | B81C 1/00269 257/415 |

(Continued)

*Primary Examiner* — Alexander O Williams

(57) ABSTRACT

Provided herein is a method including forming a MEMS cap. A cavity is formed in the MEMS cap wafer, and a bond material is deposited on the MEMS cap wafer, wherein the bond material lines the cavity after the depositing. The MEMS cap wafer is bonded to a MEMS device wafer, wherein the bond material forms a bond between the MEMS cap wafer and the MEMS device wafer. A MEMS device is formed in the MEMS device wafer. The bond material is removed from the cavity.

14 Claims, 4 Drawing Sheets

(56) References Cited

U.S. PATENT DOCUMENTS

| | | |
|---|---|---|
| 2015/0375995 A1* | 12/2015 | Steimle .............. B81C 1/00246 257/418 |
| 2016/0075554 A1 | 3/2016 | Huang et al. |
| 2016/0145094 A1* | 5/2016 | Lee ....................... B81B 7/0058 257/774 |
| 2016/0185592 A1* | 6/2016 | Hsieh ..................... C23C 16/50 257/415 |
| 2016/0229685 A1* | 8/2016 | Boysel .................... B81B 7/007 |
| 2016/0272486 A1 | 9/2016 | Shin et al. |
| 2016/0376143 A1 | 12/2016 | Shin et al. |
| 2017/0081173 A1* | 3/2017 | Liu ..................... B81C 1/00182 |
| 2017/0107099 A1* | 4/2017 | Peng .................. B81C 1/00285 |
| 2017/0207198 A1* | 7/2017 | Vick ..................... H01L 23/481 |
| 2017/0217756 A1* | 8/2017 | Hsieh ................. B81C 1/00238 |
| 2017/0225947 A1* | 8/2017 | Chen ................. B81C 1/00269 |
| 2017/0275153 A1* | 9/2017 | Chen ................. B81C 1/00357 |
| 2018/0107854 A1* | 4/2018 | Tsai ..................... B06B 1/0666 |
| 2018/0282154 A1* | 10/2018 | Heller ................ B81C 1/00269 |
| 2018/0290882 A1* | 10/2018 | Rhee .................... B81B 7/0058 |
| 2018/0346321 A1* | 12/2018 | Takubo .................. B81B 7/02 |
| 2019/0019838 A1* | 1/2019 | Kropelnicki ...... H01L 27/14629 |
| 2019/0027522 A1* | 1/2019 | Kropelnicki ...... H01L 27/14636 |
| 2019/0064021 A1* | 2/2019 | Kuhne .................. G01L 9/0073 |
| 2019/0084826 A1* | 3/2019 | Singh ....................... B81B 7/007 |
| 2019/0092627 A1* | 3/2019 | Lin ........................ H01L 24/89 |
| 2019/0245515 A1* | 8/2019 | Hurwitz ................ H03H 9/205 |
| 2019/0258882 A1* | 8/2019 | Juncker ............. G06K 9/00604 |
| 2020/0024137 A1* | 1/2020 | Lee .......................... B81B 7/02 |
| 2020/0067487 A1* | 2/2020 | Shen ..................... H03H 9/205 |
| 2020/0096336 A1* | 3/2020 | Cook ................. B81C 1/00166 |
| 2020/0140263 A1* | 5/2020 | Flader ..................... B81B 7/02 |

* cited by examiner

```
                    ┌─────────────────────────────────┐
                    │   FORMING A MEMS CAP WAFER      │
                    │              702                │
                    └─────────────────────────────────┘
                                    │
                    ┌─────────────────────────────────┐
                    │ FORMING A CAVITY IN THE MEMS CAP WAFER │
                    │              704                │
                    └─────────────────────────────────┘
                                    │
                    ┌─────────────────────────────────┐
                    │ DEPOSITING A BOND MATERIAL ON THE MEMS CAP WAFER, WHEREIN │
                    │ THE BOND MATERIAL LINES THE CAVITY AFTER THE DEPOSITING   │
                    │              706                │
                    └─────────────────────────────────┘
                                    │
                    ┌─────────────────────────────────┐
                    │ BONDING THE MEMS CAP WAFER TO A MEMS DEVICE WAFER, WHEREIN │
                    │ THE BOND MATERIAL FORMS A BOND BETWEEN THE MEMS CAP WAFER  │
                    │         AND THE MEMS DEVICE WAFER                          │
                    │              708                │
                    └─────────────────────────────────┘
                                    │
                    ┌─────────────────────────────────┐
                    │ FORMING A MEMS DEVICE IN THE MEMS DEVICE WAFER │
                    │              710                │
                    └─────────────────────────────────┘
                                    │
                    ┌─────────────────────────────────┐
                    │ REMOVING THE BOND MATERIAL FROM THE CAVITY │
                    │              712                │
                    └─────────────────────────────────┘
```

FIG. 7

REDUCED MEMS CAVITY GAP

CROSS-REFERENCE TO RELATED APPLICATIONS

This application claims the benefit of U.S. Provisional Patent Application Ser. No. 62/754,069 filed Nov. 1, 2018, entitled "METHOD AND SYSTEM TO INCREASE CAVITY PRESSURE AND DECREASE DIELECTRIC CHARGING."

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the size of the MEMS devices, thereby resulting in die size reduction.

SUMMARY

Provided herein is a method including forming a MEMS cap wafer. A cavity is formed in the MEMS cap wafer, and a bond material is deposited on the MEMS cap wafer, wherein the bond material lines the cavity after the depositing. The MEMS cap wafer is bonded to a MEMS device wafer, wherein the bond material forms a bond between the MEMS cap wafer and the MEMS device wafer. A MEMS device is formed in the MEMS device wafer. The bond material is removed from the cavity. These and other features and advantages will be apparent from a reading of the following detailed description.

BRIEF DESCRIPTION OF DRAWINGS

FIG. 7 shows an exemplary flow diagram for removing the bond material from the cavity according to one aspect of the present embodiments.

DESCRIPTION

Figure 1:
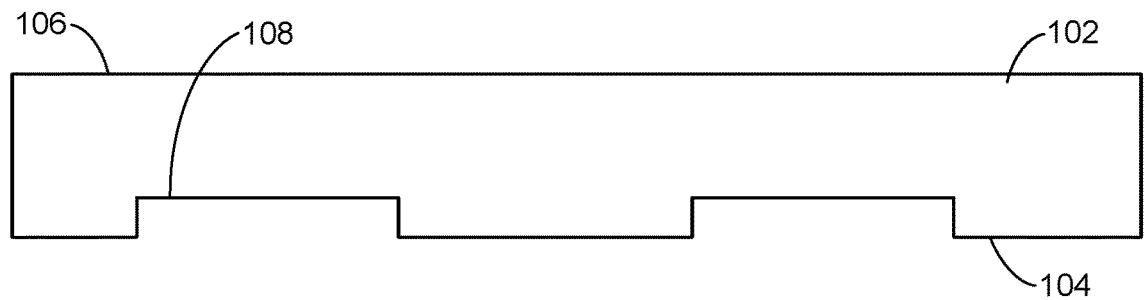
FIG. 1 shows a cap wafer including cap cavities according to one aspect of the present embodiments.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS device includes mechanical elements and may optionally include electronics (e.g. electronics for sensing). MEMS devices include but are not limited to, for example, gyroscopes, accelerometers, magnetometers, microphones, pressure sensors, etc. As technology advances, it is desirable to reduce the size of the MEMS devices, thereby resulting in die size reduction. According to embodiments described herein, the dielectric oxide in the MEMS cap cavity above the MEMS device is removed using, for example, vapor hydrofluoric acid after the MEMS actuator etch. Removal of the dielectric oxide allows reduction of the cavity gap above the MEMS device, resulting in many advantages. For example, a reduced cavity gap above a MEMS accelerometer increases the accelerometer damping by reducing the cavity volume and increasing pressure. In addition, reducing the cavity gap provides better thermal and electrostatic balance between the MEMS cap cavity and a CMOS ("complementary metal-oxide semiconductor") cavity, as well as rejection of common mode noise sources.

Referring now to FIG. 1, a cap wafer including cap cavities is shown according to one aspect of the present embodiments. A cap wafer 102 is formed using any suitable fabrication method. The cap wafer 102 may be, for example, a silicon wafer, however it is understood that embodiments are not limited to silicon wafers. The cap wafer 102 may also be referred to as a MEMS cap wafer and includes a first side 104 and a second side 106. A cap cavity 108 (e.g. MEMS cap cavity) is formed in the first side 104 of the cap wafer 102. The cap cavity 108 may be formed by any suitable fabrication method (e.g. etching, cutting, laser ablation, etc.). It is understood that in various embodiments, one or more cap cavities 108 may be formed in the cap wafer 102.

Figure 2:
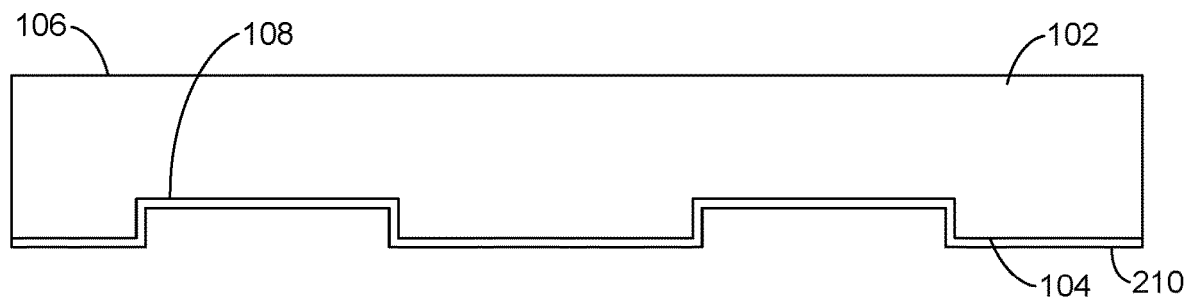
FIG. 2 shows an oxide formed on the first side and the cap cavity according to one aspect of the present embodiments.

Referring now to FIG. 2, an oxide formation on the first side and the cap cavity is shown according to one aspect of the present embodiments. A lining 210 is formed over the first side 104 using any suitable fabrication method (e.g. deposition, growth, sputtering, etc.). The lining 210 is a bond material, for example a thermal oxide growth (e.g. silicon dioxide) or chemical vapor deposition (CVD) oxide. The lining 210 covers the first side 104 and the cap cavity 108. For example, in various embodiments, the lining 210 is deposited on the on the cap wafer 102. After the lining 210 is deposited, it lines the first side 104 and the cap cavity 108.

Figure 3:
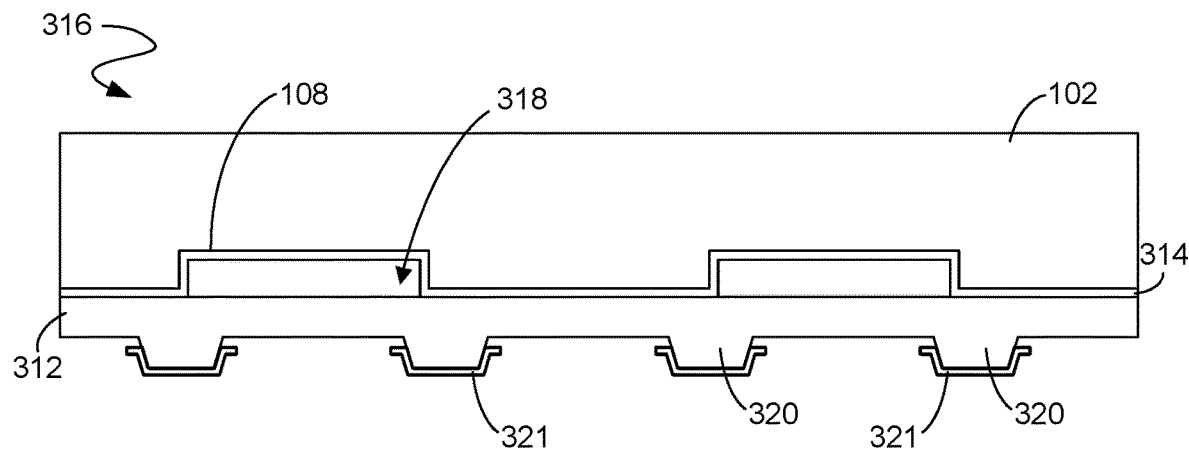
FIG. 3 shows the cap wafer fusion bonded to a MEMS device wafer including standoffs according to one aspect of the present embodiments.

Referring now to FIG. 3, the cap wafer fusion bonded to a MEMS device wafer including standoffs is shown according to one aspect of the present embodiments. A MEMS device wafer 312 is bonded to the cap wafer 102 with a bond 314 formed from the lining 210 (FIG. 2). For example, the cap wafer 102 may be fusion bonded to the MEMS device wafer 312, thereby forming a silicon oxide silicon bond. In various embodiments, the MEMS device wafer 312 is a structural layer including silicon that will be formed into various MEMS devices (e.g. accelerometer, gyroscope, etc.).

Together, the cap wafer 102 and the MEMS device wafer 312 may be referred to as a MEMS wafer 316. Therefore, the MEMS wafer 316 includes the cap wafer 102 and the MEMS device wafer 312. The cap wafer 102 and the MEMS device wafer 312 define a cavity gap 318 in the cap cavity 108. The cavity gap 318 extends from the top of the cap cavity 108 in the cap wafer 102 down to the surface of the MEMS device wafer 312.

According to embodiments described herein, the cavity gap 318 is smaller than previous cavity gaps. In addition, in some embodiments the cap cavity 108 may be sized relative to a CMOS cavity 630 (see FIG. 6). For example, the size of the cap cavity 108 may be smaller than, equal to, or larger than the size of the CMOS cavity 630.

In some embodiments, standoffs 320 are patterned on the MEMS device wafer 312, and a metal 321 (e.g. germanium) used for eutectic bonding (see FIG. 6) is deposited on the standoffs 320. The standoffs 320 define the vertical clearance between the structural layer (e.g. the MEMS device wafer 312) and a CMOS wafer (not shown but see FIG. 6). The standoffs 320 may also provide electrical contact between the MEMS wafer 316 and the CMOS wafer.

Figure 4:
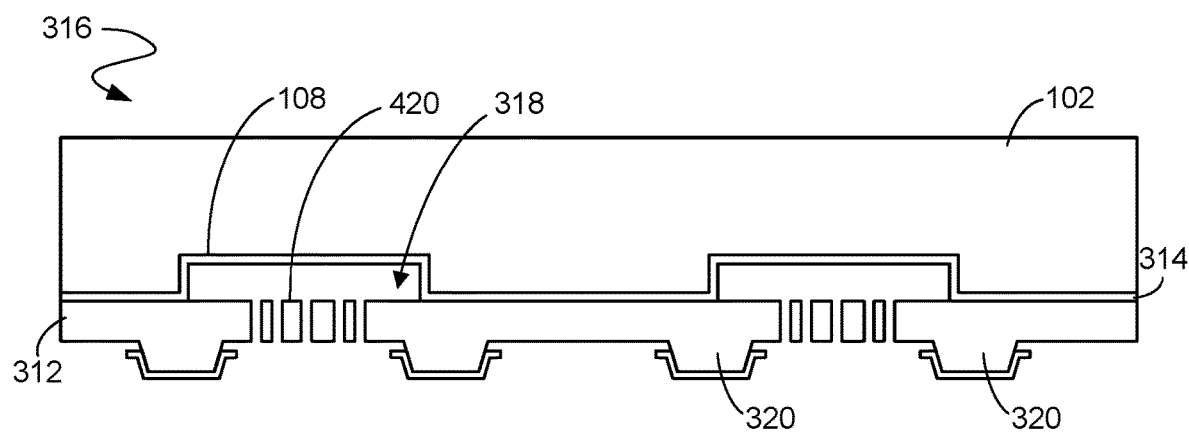
FIG. 4 shows the formation of the MEMS device according to one aspect of the present embodiments.

Referring now to FIG. 4, the formation of the MEMS device is shown according to one aspect of the present embodiments. A MEMS device 420 has been formed in the MEMS device wafer 312 using any suitable fabrication method, for example etching the device wafer 312 using deep reactive ion etching ("DRIE"). Fabrication methods may include, but are not limited to, etching, cutting, laser ablation, deposition, growth, sputtering, etc. The MEMS device 420 may be any MEMS device, including, but not limited to, gyroscopes, accelerometers, microphones, and pressure sensors. Therefore, the MEMS device wafer 312 includes the MEMS device 420 surrounded by the cap cavity 108.

As illustrated, the cap cavity 108 overlies the MEMS device 420. Thus, the cap cavity 108 and the MEMS device 420 define the cavity gap 318 overlying the MEMS device 420. At this stage of manufacture, the bond 314 lines the cap cavity 108. In various embodiments, the bond 314 may be a fusion bond, and the bond material may include a fusion bond oxide.

Figure 5:
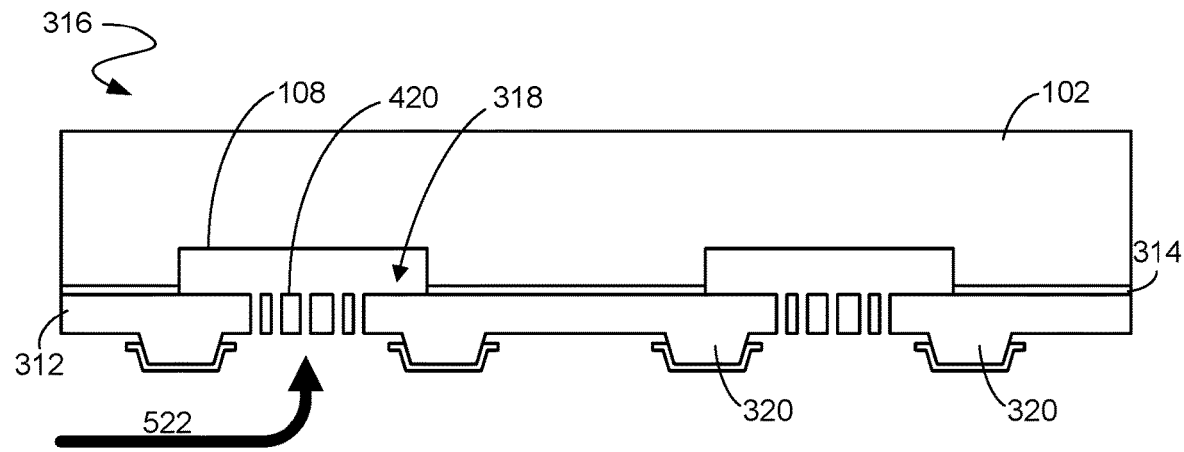
FIG. 5 shows the removal of the bond in the cap cavity according to one aspect of the present embodiments.

Referring now to FIG. 5, removal of the bond in the cap cavity is shown according to one aspect of the present embodiments. The bond 314 has been removed from the inside of the cap cavity 108. As such, the cap cavity 108 is no longer lined with the bond material (e.g. the bond 314). In various embodiments, the bond material is removed through the MEMS device 420, and the cap wafer 102 remains bonded to the MEMS device wafer 312 after the removal of the bond material.

The bond material may be removed from the cap cavity 108 by selective etching of the bond 314. For example, the selective etching may include introducing (see FIG. 5 arrow 522) vapor HF ("hydrofluoric acid"), liquid HF, BOE ("buffered oxide etchant"), or ME ("reactive ion etch") into the cap cavity 108 through the MEMS device 402 to remove the bond material. It is understood that in the embodiments described herein, removal of the bond material from the cap cavity 108 occurs after the bonding of the MEMS device wafer 312 to the cap wafer 102, as described above in reference to FIG. 3. Furthermore, it is understood that in various embodiments all of the of the bond material may be removed from the cap cavity 108, or some of the bond material may be removed from portions of the cap cavity 108.

Figure 6:
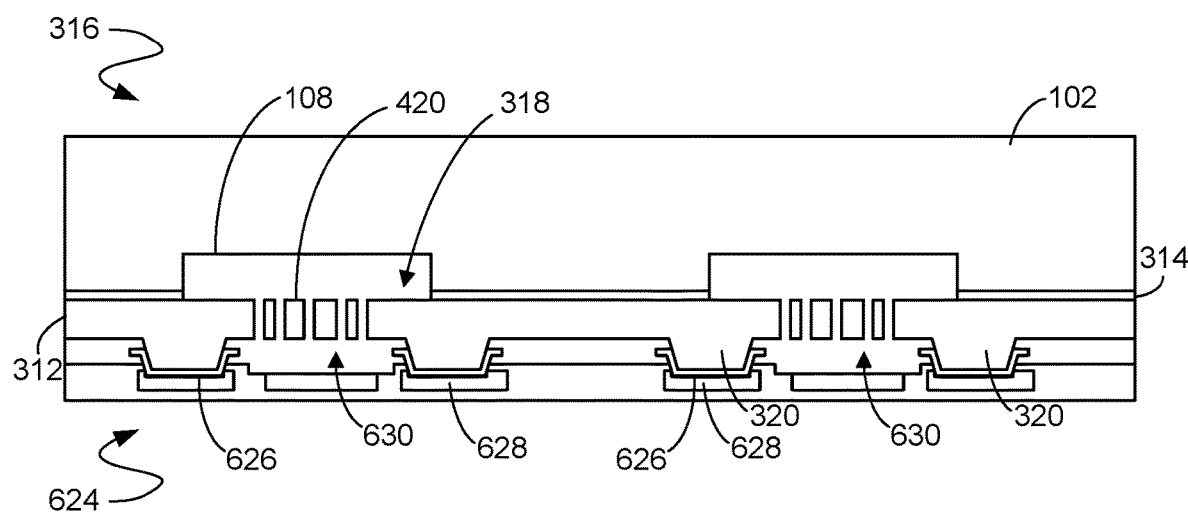
FIG. 6 shows eutectic bonding of the MEMS wafer to a CMOS wafer according to one aspect of the present embodiments.

Referring now to FIG. 6, eutectic bonding of the MEMS wafer to a CMOS wafer is shown according to one aspect of the present embodiments. The MEMS wafer 316 is eutecticly bonded to a CMOS wafer 624 with eutectic bonds 626. In various embodiments, the eutectic bonds 626 are aluminum-germanium (AlGe) bonds. In other embodiments, the eutectic bonds 626 can be formed by tin-copper, tin-aluminum, gold-germanium, gold-tin, or gold-indium. The eutectic bonds 626 bond the standoffs 320 to bond pads 628 on the CMOS wafer 624. As such, the eutectic bonds 626 provide electrical connections between the MEMS wafer 316 and the CMOS wafer 624. The MEMS device wafer 312, the standoffs 320, and the CMOS wafer 624 define a CMOS cavity 630 below the MEMS device 420. In some embodiments, eutectic bonds 626 form a hermetic seal around the MEMS device 420. Thus, the pressure and/or gas composition may be set within the cap cavity 108 and the CMOS cavity 630. For example, the pressure may be set to greater than, equal to, or lesser than atmospheric pressure. It is understood that the CMOS wafer 624 is an integrated circuit ("IC") substrate with one or more electrical circuits.

As previously discussed, reducing the size of the cap cavity 108 results in a smaller cavity gap 318. This is advantages because, for example, the reduced cavity gap 318 above a MEMS accelerometer (e.g. the MEMS device 420) increases the accelerometer damping by reducing the volume and increasing pressure of the cap cavity 108. In addition, reducing the cavity gap 318 provides better thermal and electrostatic balance between the cap cavity 108 (e.g. MEMS cap cavity) and the CMOS cavity 630, as well as rejection of common mode noise sources.

However, the bond 314 lining the cap cavity 108 (see FIG. 4) causes problems with the reduction of the cap cavity 108. For example, contact between the MEMS device 420 and the bond 314 lining the cap cavity 108 can result in charging, which can drift over the lifetime of the product and cause performance degradation. Therefore as previously discussed, according to embodiments described herein, the bond 314 lining the cap cavity 108 is removed after fusion bonding of the MEMS device wafer 312 to the cap wafer 102. As a result, the size reduction of the cap cavity 108 is advantageous instead of detrimental (as described above).

Furthermore, it is important that removal of the bond 314 lining the cap cavity 108 occurs after fusion bonding, in order to ensure that the lining 210 (see FIG. 2) is not damaged. For example, attempts to remove the lining 210 from the cap cavity 108 prior to fusion bonding produce damage to the lining 210 in other areas. For example, even minor damage caused to the lining 210, using processes such as selective etching or masking prior to fusion bonding, can result in poor fusion bonding of the MEMS device wafer 312 to the cap wafer 102.

FIG. 7 shows an exemplary flow diagram for removing the bond material from the cavity according to one aspect of the present embodiments. At block 702, a MEMS cap wafer is formed. At a block 704, a cavity is formed in the MEMS cap wafer. At a block 706, a bond material is deposited on the MEMS cap wafer, wherein the bond material lines the cavity after the depositing. At a block 708, the MEMS cap wafer is bonded to a MEMS device wafer, wherein the bond material forms a bond between the MEMS cap wafer and the MEMS device wafer. At a block 710, a MEMS device is formed in the MEMS device wafer. In various embodiments, the MEMS device may be a gyroscope or accelerometer.

At a block 712, the bond material is removed from the cavity. In some embodiments, the removing is after the bonding. In further embodiments, the bond material is removed through the MEMS device, and the MEMS cap wafer remains bonded to the MEMS device wafer after the removing. In various embodiments the bond material may be selectively etched. The selective etching may include introducing any one of vapor hydrofluoric acid, liquid HF, BOE, or RIE into the cavity through the MEMS device.

In some embodiments, a MEMS wafer includes the MEMS cap wafer and the MEMS device wafer, and the MEMS wafer is eutecticly bonded to a CMOS wafer. In various embodiments the bond material includes an oxide.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
   forming a micro-electro-mechanical system ("MEMS") cap wafer;
   forming a cavity in the MEMS cap wafer;
   depositing a bond material on the MEMS cap wafer, wherein the bond material lines the cavity after the depositing;
   bonding the MEMS cap wafer to a MEMS device wafer, wherein the bond material forms a bond between the MEMS cap wafer and the MEMS device wafer;
   forming a MEMS device in the MEMS device wafer; and
   removing the bond material from the cavity.

2. The method of claim 1, wherein the bond material is removed through the MEMS device, and wherein further the MEMS cap wafer remains bonded to the MEMS device wafer after the removing.

3. The method of claim 1, further comprising selective etching the bond material.

4. The method of claim 3, wherein the selective etching includes introducing any one of vapor HF ("hydrofluoric acid"), liquid HF, BOE ("buffered oxide etchant"), or RIE ("reactive ion etch") into the cavity through the MEMS device.

5. The method of claim 1, wherein the removing includes removing with vapor HF ("hydrofluoric acid"), liquid HF, BOE ("hydrofluoric acid"), or RIE ("reactive ion etch").

6. The method of claim 1, wherein a MEMS wafer includes the MEMS cap wafer and the MEMS device wafer, and further comprising eutecticly bonding the MEMS wafer to a CMOS wafer.

7. The method of claim 1, wherein the bond material includes an oxide.

8. The method of claim 1, wherein the removing is after the bonding.

9. The method of claim 1, wherein the MEMS device is a gyroscope, accelerometer, microphone, or pressure sensor.

10. The method of claim 1, wherein forming the MEMS device includes etching the device wafer using deep reactive ion etching ("DRIE").

11. An apparatus comprising:
    a cap cavity in a micro-electro-mechanical system ("MEMS") cap wafer, the cap cavity overlying a MEMS device;
    a MEMS wafer including the MEMS cap wafer and a MEMS device wafer, the MEMS device wafer including the MEMS device; and
    a bond connecting the MEMS cap wafer to the MEMS device wafer, wherein
      the bond includes a material, and
        the material has been removed from portions of the cavity.

12. The apparatus of claim 11, further comprising
    a complementary metal-oxide semiconductor ("CMOS") wafer; and
    a eutectic bond electrically connecting he CMOS wafer to the MEMS wafer.

13. The apparatus of claim 11, wherein the bond is a fusion bond.

14. The apparatus of claim 11, wherein the material is a dielectric fusion bond oxide.

* * * * *